United States Patent [19]

Lapping et al.

[11] Patent Number: 5,650,727

[45] Date of Patent: Jul. 22, 1997

[54] CIRCUIT CONTINUITY TESTING DEVICE

[75] Inventors: Harold Lapping, Rockville; David N. Rohde, Severna Park, both of Md.; Steven R. Saurez, Hamilton, Va.

[73] Assignee: Wizaed Devices, Inc., Potomac, Md.

[21] Appl. No.: 418,273

[22] Filed: Apr. 7, 1995

[51] Int. Cl.⁶ ................................................ G01R 27/14
[52] U.S. Cl. ........................ 324/502; 324/550; 324/133; 324/724
[58] Field of Search .......................... 324/722, 724, 324/133, 555, 556, 540, 502, 550

[56] References Cited

U.S. PATENT DOCUMENTS

| | | | |
|---|---|---|---|
| 4,027,236 | 5/1977 | Stewart | 324/133 |
| 4,027,238 | 5/1977 | Loch | 324/724 |
| 4,066,953 | 1/1978 | Gold | 324/133 |
| 4,758,777 | 7/1988 | Bossard | 324/724 |
| 4,812,740 | 3/1989 | Shutts | 324/133 |
| 4,999,574 | 3/1991 | Stephens | 324/133 |
| 5,367,250 | 11/1994 | Whisenand | 324/133 |
| 5,477,152 | 12/1995 | Hayhurst | 324/133 |

FOREIGN PATENT DOCUMENTS

| | | | |
|---|---|---|---|
| 252278 | 12/1987 | Germany | 324/724 |
| 297012 | 12/1991 | Germany | 324/724 |

*Primary Examiner*—Kenneth A. Wieder
*Assistant Examiner*—Jose M. Solis
*Attorney, Agent, or Firm*—Michael Aronoff

[57] ABSTRACT

A circuit continuity test device is disclosed. The device utilizes a series circuit to provide a completed circuit for an external explosive or pyrotechnic circuit. The series circuit has a switch in the form of a light emitting diode and a power source. Upon coupling to a continuous external circuit, the diode is placed in an on state thereby illuminating and indicating a continuous external circuit.

The device housing is a simple, compact and solid part. This allows the device to be used in a variety of environmental conditions and easily and inexpensively manufactured.

9 Claims, 5 Drawing Sheets

CIRCUIT CONTINUITY TESTING DEVICE

BACKGROUND OF THE INVENTION

1. Field of the Invention

The present invention relates generally to circuit testing devices. More specifically, the present invention is directed to a device for testing circuit continuity in firing circuits or electrically initiated pyrotechnic devices.

Prior to igniting an explosive or pyrotechnic device, it is customary to check the circuit in order to insure that at the desired time the device will operate.

When working with explosive and/or pyrotechnic devices, testing devices must meet safety standards which insure that accidental ignition of explosive devices incorporated in the circuit or device does not occur.

Further, such testing devices are preferably quick and easy to utilize and will operate in a variety of environmental conditions.

2. Brief Description of the Prior Art

Known devices for testing circuit continuity are typically meters of various types. In other words, a meter is used to check, for example, the current or resistance of a circuit. If the meter provides feedback from the test, as a direct by-product of the information, there is a confirmation that the circuit is complete. If the meter is unable to produce a reading, the tester assumes that the circuit is broken at some point.

For example, a galvanometer is a device known for testing circuits. Generally, the galvanometer is an instrument for detecting and measuring the strength of an electric current. Galvanometers depend on the fact that force is generated by an electric current flowing in a magnetic field. One example of a galvanometer comprises a magnetic needle suspended in a wire coil. As current passes through the coil, the needle is deflected. The deflection is proportionate to the current, therefore by measuring the deflection on a calibrated scale the current may be determined. The deflection may be measured by an optical system, e.g. reflection of a beam of light from a small mirror attached to the needle and observation of the reflection beam on a scale. The galvanometer may have a fixed coil and a movable magnet or vice versa.

Only as a logical conclusion from the measurement of the current does one know that the circuit is complete.

The known devices are relatively large and complex and require a variety of moving parts. Further, they are susceptible to failure due to environmental conditions and component breakdown. Still further, as known devices typically have several moving parts for measurements, they generally require more power and/or current flow.

SUMMARY OF THE INVENTION

The present invention is directed to overcoming the aforementioned drawbacks of the related art, as described above.

It is an object of the present invention to provide an improved device for circuit continuity testing which can be implemented using solid state circuitry.

It is another object of the present invention to provide a compact, hand held, easy to operate, circuit testing device.

Still another object of the present invention is to provide an inexpensive, easily manufactured device.

Still another object of the present invention is to provide a circuit testing device which may be used in all weather conditions and provide improved safety.

These and other objects of the present invention will be apparent from the following detailed description.

DESCRIPTION OF THE PREFERRED EMBODIMENT

Figure 1:
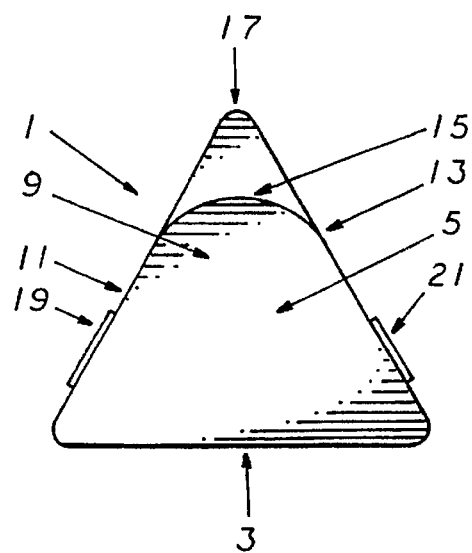
FIG. 1 is a front elevational view of a first embodiment of a housing of the present invention.
Figure 2:
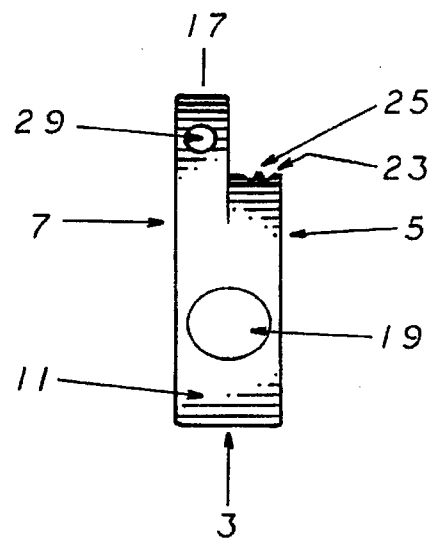
FIG. 2 is a left side elevational view of the housing of FIG. 1, wherein a right side elevational view is a mirror image thereof.
Figure 3:
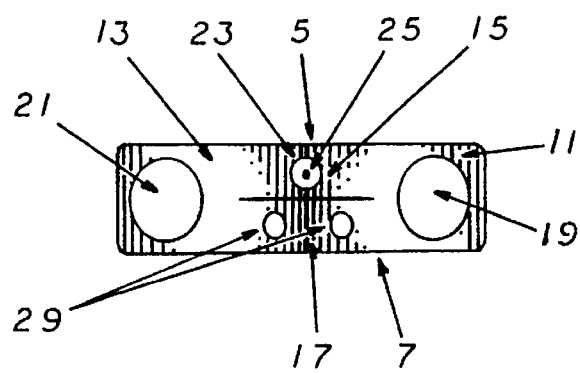
FIG. 3 is a top plan view of the housing of FIG. 1.
Figure 4:
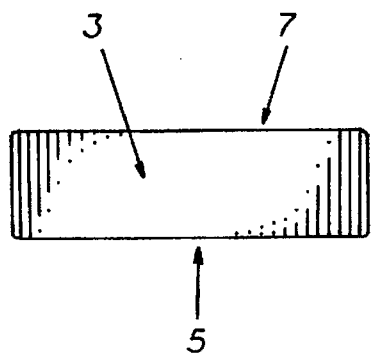
FIG. 4 is a bottom plan view of the housing of FIG. 1.
Figure 5:
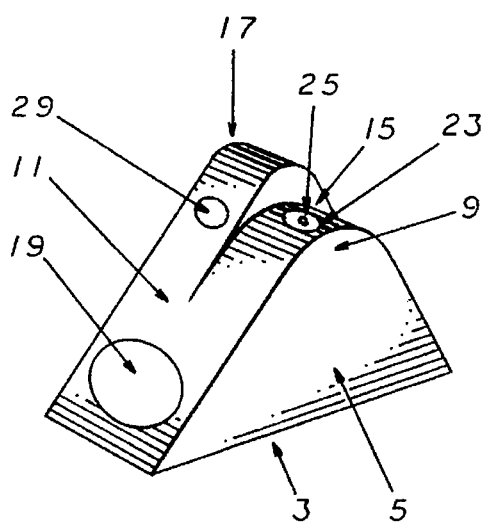
FIG. 5 is a front left perspective view of the housing of FIG. 1.
Figure 6:
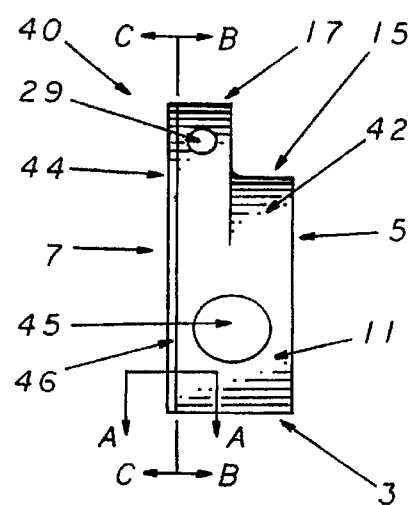
FIG. 6 is a left side elevational view of a second embodiment of a housing of the present invention, wherein a right side elevational view is a mirror image thereof.
Figure 7:
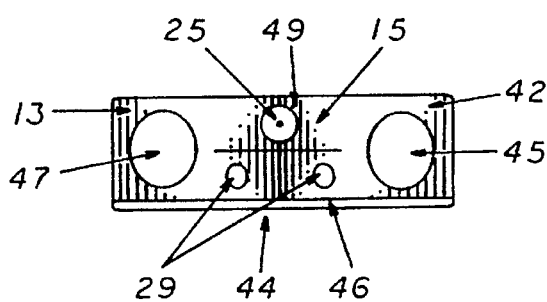
FIG. 7 is a top plan view of the housing of FIG. 6.
Figure 8:
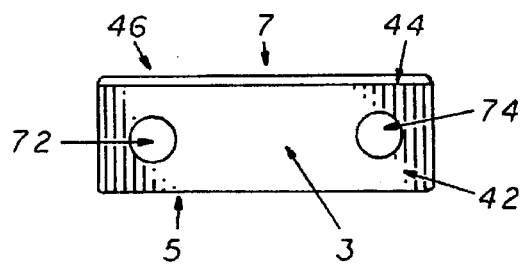
FIG. 8 is a bottom plan view of the housing of FIG. 6.
Figure 9:
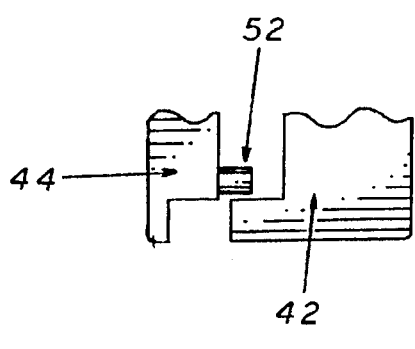
FIG. 9 is an enlarged sectional plan view of FIG. 6 along line A—A.
Figure 10:
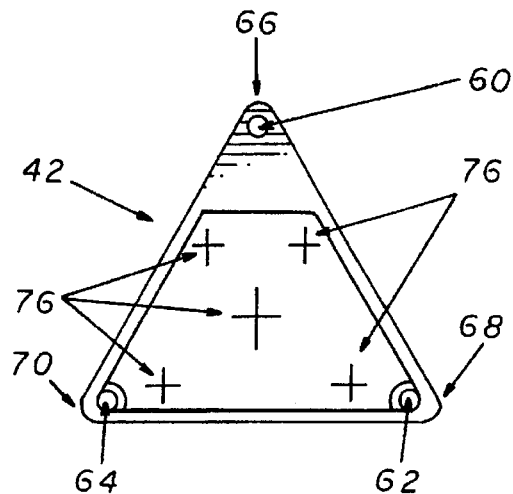
FIG. 10 is a sectional elevational view of FIG. 6 along line B—B.
Figure 11:
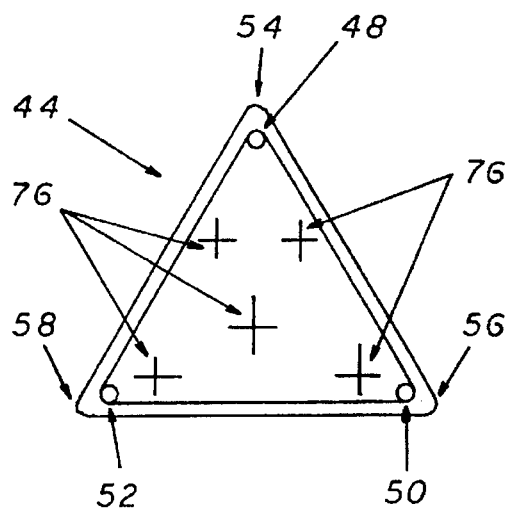
FIG. 11 is a sectional elevational view of FIG. 6 along line C—C.
Figure 12:
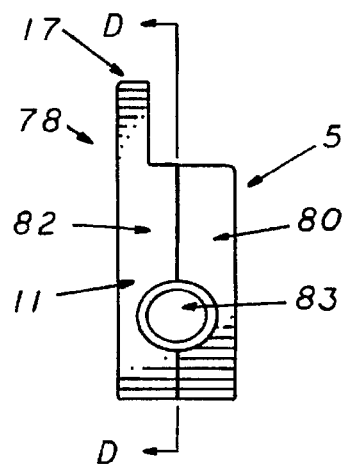
FIG. 12 is a left side elevational view of a third embodiment of a housing of the present invention illustrating a front portion and a rear portion, wherein a right side elevational view is a mirror image thereof.
Figure 13:
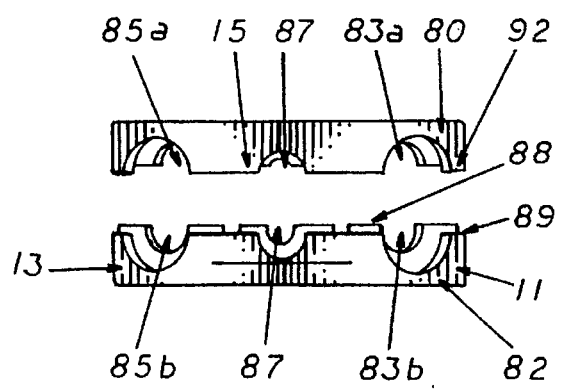
FIG. 13 is a top plan view of the housing of FIG. 12, wherein the front portion and the rear portion are separated.
Figure 14:
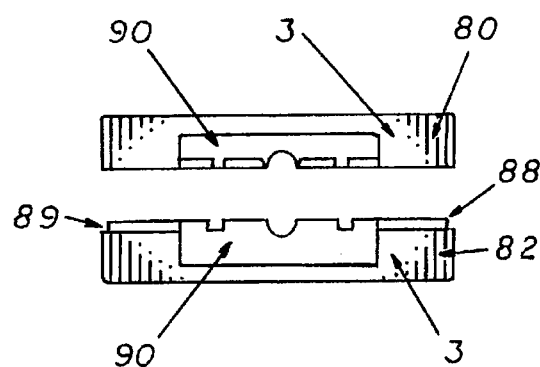
FIG. 14 is a bottom plan view of the housing of FIG. 12, wherein the front portion and the rear portion are separated.
Figure 15:
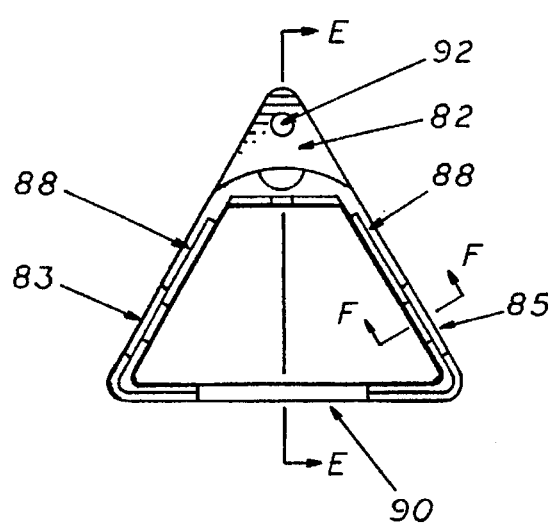
FIG. 15 is a sectional front elevational view of the housing of FIG. 12 along line D—D illustrating the rear portion.
Figure 16:
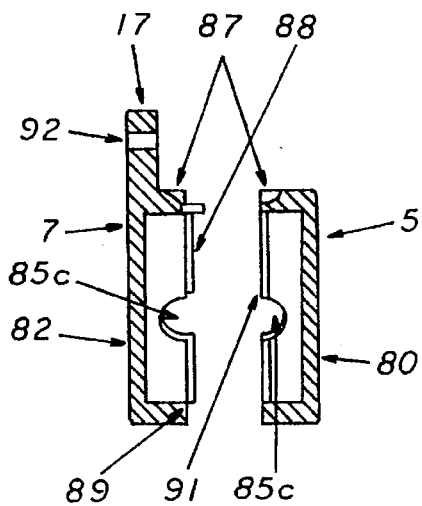
FIG. 16 is a sectional side elevational view of the housing of FIG. 15 along line E—E illustrating the front portion and the rear portion separated.
Figure 17:
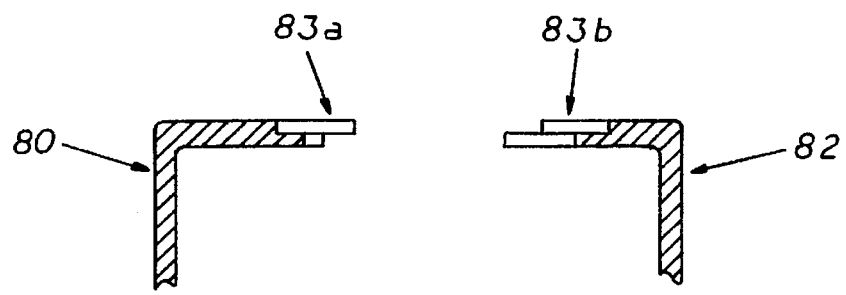
FIG. 17 is a sectional view of the housing of FIG. 15 along line F—F illustrating the front portion and the rear portion.

A first embodiment of a housing 1 according to the invention will now be described with reference to FIGS. 1-5.

The housing 1 has a base 3 having a generally flat surface. The base 3 allows the housing 1 to rest on a supporting surface or a user's fingers during circuit testing, as will be described below. The housing 1 further has a front wall 5 extending up from the base 3 and a rear wall 7 also extending up from the base 3. The front wall 5 has a generally triangular shape with a dome-like apex 9. The rear wall 7 has a generally triangular shape. Further, the housing 1 has side walls 11 and 13 extending up from the base 3 and connecting the front wall 5 and the rear wall 7. A forward portion of each side wall 11 and 13 extends upward to form a forward top portion 15. The forward top portion 15 is preferably rounded. A rearward portion of each side wall 11 and 13 extends upward to form a rearward top portion 17. The rearward top portion 17 is relatively higher than the front top portion 15.

Each side wall 11 and 13 incorporates an electrode or contact element 19 and 21, respectively. The electrodes 19 and 21 are positioned such that they are substantially in the same plane as the side walls 11 and 13, respectively. The electrodes 19 and 21 may be made from any good conductive material, for example copper, which will conduct an electric current.

The forward top portion 15 has a generally hemispherical, concave cutout 23 centrally positioned therein. A light emitting diode or LED 25 is positioned within the cutout 23. The electrodes 19 and 21 and the LED 25 will be described in greater detail below.

The first embodiment of the housing 1 of the present invention is formed by a poured mold method. An internal circuit 27 for determining external circuit continuity, as described below, is set within a mold (not shown) having the desired external shape of the housing 1. A moldable housing material is poured into the mold and allowed to set. A solid, molded housing 1 is thereby produced. As a result, the internal circuit 27 is sealed from the external environment. Further, the internal circuit 27 is secure from damage due to shock, heat, moisture and compression. In other words, a device is produced which can be used in a variety of conditions and which will stand up to a tremendous amount of abuse, thereby sustaining a long life while in field use.

The housing material will preferably have a high hardness measure, high tensile strength, resist compression, cure relatively quick and be resistant to heat and/or flames. A material sold under the trade name E.Z. Plastic, produced by Zeller International, Downsville, N.Y., is employed as the housing material. However, any similar material which will provide the same properties is contemplated.

The rearward top portion 17 may include a horizontal through hole 29. The through hole 29 may be used to retain means for securing the housing to a user, for example a lanyard (not shown).

A second embodiment of a housing 40 of the present invention will now be described with reference to FIGS. 6–11. It should be noted that the external features of the housing 40 are similar to those of housing 1, illustrated in FIGS. 1–5. As such, similar elements will be numbered alike. Further, unless otherwise specifically stated, the housing 40 is as described above with reference to housing 1. The housing 40 is shown without the internal circuit 27 installed.

The fundamental distinction between housing 40 and housing 1 is that housing 40 is primarily a shell. Housing 40 comprises a front portion 42 and a rear portion 44. Each portion 42 and 44 is formed by an injection molding process. Further, the front portion 42 and the rear portion 44 are preferably formed of a high impact plastic. Once the front portion 42 and the rear portion 44 are formed, the internal circuit 27, described below, is installed in the front portion 42 and the front portion 42 and the rear portion 44 are mated together at seam line 46. An opening 45 is formed in sidewall 11 in which electrode 19 is situated. A similar opening 47 is formed in sidewall 13 to accommodate electrode 21. Further, an opening 47 is formed in the forward top portion 15 to accommodate LED 25.

The front portion 42 and the rear portion 44 are aligned with respect to each other in order to form a completed housing 40 by a pin-hole arrangement. Pins 48, 50 and 52 are formed at each corner 54, 56 and 58, respectively, of the rear portion 44. A corresponding hole 60, 62 and 64 is formed at each corner 66, 68 and 70, respectively, of the front portion 42. When mated together, the pins 48, 50 and 52 engage holes 60, 62 and 64, respectively. As a result, the front portion 42 and the rear portion 44 remain aligned.

Once the front portion 42 and the rear portion 44 are mated together, the housing 40 may be filled with a filler material to provide a more stable and solid device. A material such as the E-Z Plastic, described above, or a similar material, is preferably used. The material is poured into a first opening or hole 72 located in the base 3. As the housing 40 is filled with material air present inside the housing 40 escapes through a second opening or hole 74. The housing 40 is filled until the material fills all of the available space within the housing 40. Once the material is allowed to cure, a solid device is obtained.

Interlocking projections 76 may be formed as part of the front portion 42 and as part of the rear portion 44. These projections 76 provide an improved coupling between the front portion 42, the rear portion 44 and the filler material. The projections 76 are merely crosses which are formed during the injection molding process of the front portion 42 and the rear portion 44. Five projections 76, for example, may be formed as part of the front portion 42 and as part of the rear portion 44. The projections 76 are formed such that the projections 76 formed as part of the front portion 42 align with the projections 76 formed formed as part of the rear portion 44 when the front portion 42 and the rear portion 44 are mated. When the filler material is poured into the housing 40, the filler material surrounds and cures around the projections 76 thereby coupling the front portion 42 and the rear portion 44 to the filler material.

A third embodiment of a housing 78 of the invention will now be described with reference to FIGS. 12–17. It should be noted that the external features of the housing 78 are similar to those of housing 1, illustrated in FIGS. 1–5. As such, similar elements will be numbered alike. Further, unless otherwise specifically stated, the housing 78 is as described above with reference to housing 1. The housing 78 is shown without the internal circuit 27 installed.

The fundamental distinction between housing 78 and housing 1 is that housing 78 is primarily a shell. Housing 78 comprises a front portion 80 and a rear portion 82. Each portion 80 and 82 is formed by an injection molding process. Further, the front portion 80 and the rear portion 82 are preferably formed of a high impact plastic. Once the front portion 80 and the rear portion 82 are formed, the internal circuit 27, described below, is installed in the front portion 80 and the front portion 80 and the rear portion 82 are mated together at seam line 84. An opening 83 is formed in sidewall 11. Front portion 80 provides half of the opening 83a and rear portion 82 provides the other half of the opening 83b in which electrode 19 is situated. A similar opening 85 is formed in sidewall 13 to accommodate electrode 21. Further, an opening 87 is formed in the forward top portion 15 to accommodate LED 25.

The front portion 80 and the rear portion 82 are aligned with respect to each other in order to form a completed housing 78 by a lip-overhang arrangement. The rear portion 82 is formed with a lip 88 projecting from the rear portion 82 about a peripheral edge 89. The front portion 80 is formed with a recess or overhang 91 formed about a peripheral edge 92 of the front portion 80. When the front portion 80 and the rear portion 82 are mated together, the lip 88 engages the recess 91 such that the front portion 80 and the rear portion 82 are fixedly aligned. As with the housing 40, described above, a filler material may be poured into the housing 78 in order to provide a solid, stable device. One large opening 90 is shown in the base 3 of housing 78. The filler material is poured into the housing 78 through the opening 90 until the shell is full of filler material. The plural hole structure, illustrated and described above with reference to the second housing 40, may be used in the third housing 78. Further, the single opening structure, illustrated and described above with reference to the third housing 78, may be used in the second housing 40. Still further, the interlocking projections 70, illustrated and described above with reference to the second housing 40 may be incorporated into the third housing 78.

Figure 18:
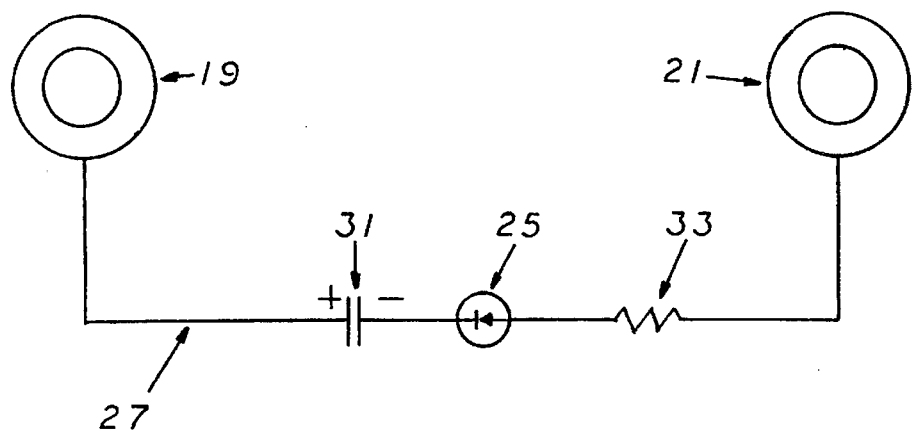
FIG. 18 is a first embodiment of an internal circuit of the present invention.

The internal circuit 27, referenced above, will now be described with reference to FIG. 18. The internal circuit 27 comprises a simple series circuit design. No analog or moving parts are incorporated in the design, thereby making the device well suited for demolition field operations. The components described below are connected using point-to-point wiring. A power source or battery 31 is connected to the first electrode 19 at a first, positive battery terminal. The battery 31 is also connected from a second, negative battery terminal to the diode 25 at a first, cathode terminal. The diode 25 is connected, from a second, anode terminal, to a load resistor 33 at a first resistor lead. The resistor 33 is connected, from a second resistor lead, to the second electrode 21. The resistor 33 provides current protection for the diode 25. As such the resistor 33 is not necessary to the circuit, but adds desirable protection for the diode 25.

The battery 31 may be any battery which will operate in light of the manufacturing parameters described above and will satisfy the circuit design parameters describe below. However, a three (3) volt dc, lithium battery is preferred. The diode 25 may be a standard diode. In the preferred embodiment, the diode 25 is a 1 mA, 3-volt device, which requires approximately 1.7 volts to activate and has a potential life of 1000 hours. The resistor 33 is preferably a 39 ohm resistor, however, this is merely a design choice and should not be limited thereto.

In operation the internal circuit 27 acts as a type of bridge between the two leads of the external circuit. If the external circuit is continuous, then the internal circuit 27 will act to complete or close the external circuit. The current supplied from the battery 31 will travel the external circuit and return to the internal circuit 27. As current reaches the diode 25, assuming enough current is present, it will go from an off state to an on state. In this sense the diode 25 acts as a type of switch. If the external circuit is continuous and current reaches the diode 25, the diode 25 is switched to the on state indicating external circuit continuity. If the external circuit is not continuous, current will not reach the diode 25 and it will remain in the off state. As an LED is used for diode 25, when current reaches the diode 25 and switches the diode 25 to the on state, the light of the diode 25 turns on. This informs the tester that the external circuit is continuous.

The internal circuit 27 of the present invention is designed to provide a very safe test device. During testing of an explosive or pyrotechnic circuit, it is imperative that a current is sent through the external explosive/pyrotechnic circuit which will not accidentally detonate the external circuit. The Mine Safety Division of the Department of Labor and the Institute of Makers of Explosives have set a fifty (50) milliamp safe limit on continuity test devices. The internal circuit 27 of the present invention is designed to draw only two (2) milliamps. This provides approximately a 2400% safety factor over the established safety limit. Further, the internal circuit design of the present invention will provide in excess of 150 hours of continuous operation or the equivalent of 108,000 five second circuit tests. Still further, the internal circuit of the present invention is capable of testing an external circuit of approximately 1750 yards.

The present invention is designed for easy operation. If the housing 1 is used with a lanyard, so that it hangs from a user's neck, the user simply places a first lead of the external circuit in contact with the first electrode 19 and presses one finger against the first lead to provide a good contact with the electrode 19. Then, the user places a second lead of the external circuit in contact with the second electrode 21 and presses another finger against the second lead to provide a good contact with the electrode 21. If the external circuit is continuous, the LED 25 will switch to the on state and illuminate.

The present invention may also be used unsecured from a user. In this case, the housing 1 is placed so that the base 3 rests on a portion of the user's hand(s), for example on the user's index fingers. Then, as stated above, one external circuit lead is pressed against each electrode 19 and 21, using for example, one thumb for each electrode 19 and 21. Again, if there is a continuous external circuit, the LED 25 will turn to the on state and illuminate.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A device for testing electrical continuity of an explosive circuit comprising:

a housing, having a first sidewall and a second sidewall wherein the first and second sidewalls are in two different planes;

a first electrode for coupling a first lead of the explosive circuit to an internal circuit carried within said housing, wherein said first electrode is carried by said first sidewall;

a second electrode for coupling a second lead of the explosive circuit to said internal circuit, wherein said second electrode is carried by said second sidewall;

wherein said internal circuit is electrically coupled to said first electrode at a first terminal and to said second electrode at a second terminal, and the internal circuit is of a simple series design comprising a power source and a switch having an ON state and an OFF state and a load resistor, wherein the switch switches to the ON state when the explosive circuit is continuous and wherein said power source and said switch and said load resistor are in series connection between said first and second electrodes.

2. A hand-held circuit continuity test device for testing an explosive circuit comprising:

a base, having a first side and a second side in spaced relation;

a first side wall extending up from said base first side;

a second side wall extending up from said base second side;

a top portion coupling said first side wall and said second side wall;

a first electrode mounted in a plane of said first side wall for coupling to a first lead of said explosive circuit and;

a second electrode mounted in a plane of said second side wall for coupling to a second lead of said explosive circuit.

3. A circuit continuity test device as claimed in claim 2, further comprising a means for indicating continuity of an external circuit, mounted on said top portion.

4. A circuit continuity test device as claimed in claim 3, wherein said indicating means is a light emitting diode.

5. A device for testing electrical continuity of an explosive circuit as claimed in claim 1, wherein said switch provides external indication that said explosive circuit is continuous and said switch is a light emitting diode.

6. A circuit continuity test device as claimed in claim 4, wherein said top portion has an indentation and said light emitting diode is mounted therein.

7. A circuit continuity test device as claimed in claim 2, wherein said device has a generally domed-triangular vertical cross section.

8. A circuit continuity test device as claimed in claim 2, further comprising a series circuit coupling said first electrode and said second electrode.

9. A circuit continuity test device as claimed in claim 2, wherein said device is a solid, integrated part.

* * * * *